(12) United States Patent
Loiseau et al.

(10) Patent No.: US 10,692,852 B2
(45) Date of Patent: Jun. 23, 2020

(54) SILICON-CONTROLLED RECTIFIERS WITH WELLS LATERALLY ISOLATED BY TRENCH ISOLATION REGIONS

(71) Applicant: GLOBALFOUNDRIES Inc., Grand Cayman (KY)

(72) Inventors: Alain Loiseau, Williston, VT (US); You Li, South Burlington, VT (US); Mickey Yu, Essex Junction, VT (US); Tsung-Che Tsai, Essex Junction, VT (US); Souvick Mitra, Essex Junction, VT (US); Robert J. Gauthier, Jr., Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/171,760

(22) Filed: Oct. 26, 2018

(65) Prior Publication Data
US 2020/0135715 A1    Apr. 30, 2020

(51) Int. Cl.
*H01L 29/74* (2006.01)
*H01L 27/02* (2006.01)
(Continued)

(52) U.S. Cl.
CPC .... *H01L 27/0262* (2013.01); *H01L 21/76224* (2013.01); *H01L 29/0649* (2013.01); *H01L 29/66393* (2013.01); *H01L 29/7436* (2013.01)

(58) Field of Classification Search
CPC .......... H01L 21/76224; H01L 27/0262; H01L 29/0649; H01L 29/66393; H01L 29/7436
(Continued)

(56) References Cited

U.S. PATENT DOCUMENTS

| 6,465,848 B2 * | 10/2002 | Ker ................ H01L 27/0251 257/335 |
| 6,545,321 B2 * | 4/2003 | Morishita ........ H01L 27/0262 257/141 |

(Continued)

OTHER PUBLICATIONS

Wang et al., "On a Dual-Polarity On-Chip Electrostatic Discharge Protection Structure", IEEE Transactions on Electron Devices, vol. 48, No. 5, May 2001.

(Continued)

*Primary Examiner* — Tan N Tran
(74) *Attorney, Agent, or Firm* — Thompson Hine LLP; Anthony Canale

(57) ABSTRACT

Silicon-controlled rectifiers and methods for forming a silicon-controlled rectifier. A first well of a first conductivity type is arranged in a substrate, and second and third wells of a second conductivity type are arranged in the substrate between the first well and the top surface of the substrate. A deep trench isolation region is laterally arranged between the first well of the second conductivity type and the second well of the second conductivity type. The second well is adjoined with the first well along a first interface, the third well is adjoined with the first well along a second interface, and the deep trench isolation region extends the top surface of the substrate past the first interface and the second interface and into the first well. A doped region of the first conductivity type is arranged in the substrate between the second well and the top surface of the substrate.

20 Claims, 3 Drawing Sheets

(51) Int. Cl.
*H01L 21/762* (2006.01)
*H01L 29/06* (2006.01)
*H01L 29/66* (2006.01)

(58) Field of Classification Search
USPC .......................................... 257/107, 119, 658
See application file for complete search history.

(56) References Cited

U.S. PATENT DOCUMENTS

| | | | |
|---|---|---|---|
| 7,786,507 B2* | 8/2010 | Denison | H01L 29/7436 257/173 |
| 9,613,968 B2* | 4/2017 | Luan | H01L 29/742 |
| 2011/0068366 A1 | 3/2011 | Huang | |

OTHER PUBLICATIONS

Salcedo et al., "A Novel Dual-Polarity Device With Symmetrical/Asymmetrical S-Type I-V Characteristics for ESD Protection Design", IEEE Electron Device Letters, vol. 27, No. 1, Jan. 2006.
Liu et al., "An Improved Bidirectional SCR Structure for Low-Triggering ESD Protection Applications", IEEE Electron Device Letters, vol. 29, No. 4, Apr. 2008.

* cited by examiner

SILICON-CONTROLLED RECTIFIERS WITH WELLS LATERALLY ISOLATED BY TRENCH ISOLATION REGIONS

BACKGROUND

The invention relates generally to semiconductor device and integrated circuit fabrication and, in particular, to device structures for a silicon-controlled rectifier and methods for fabricating a device structure for a silicon-controlled rectifier.

An integrated circuit may be exposed to random electrostatic discharge (ESD) events that can direct potentially large and damaging ESD currents to the sensitive devices of integrated circuits on a chip. An ESD event refers to an unpredictable electrical discharge of a positive or negative current over a short duration and during which a large amount of current is directed to the integrated circuits. An ESD event may occur during post-manufacture chip handling or after chip installation on a circuit board or other carrier. The high current may originate from a variety of sources, such as the human body, a machine component, or a carrier.

Precautions may be taken to protect the integrated circuits on the chip from ESD events. One such precaution is to incorporate an on-chip protection circuit that is designed to avert damage to the sensitive devices of the integrated circuit. If an ESD event occurs, the protection circuit triggers a protection device to enter a low-impedance state that causes the protection device to conduct the ESD current to ground and away from the sensitive devices of the integrated circuit. The protection device is clamped by the protection circuit in its low-impedance state until the ESD current is drained and the ESD voltage is discharged to an acceptable level.

A type of protection device commonly deployed in such protection circuits is a silicon-controlled rectifier (SCR). The SCR is a four-layer solid state device includes three electrodes or terminals, namely an anode, a cathode, and a gate, that are distributed among the four layers. In its quiescent state, the SCR restricts current conduction to leakage current. However, a current applied to the gate by an ESD event causes the gate-to-cathode voltage to exceed an engineered threshold, known as the trigger voltage, and initiates the conduction of a forward current between the anode and cathode. Even after the trigger voltage is removed from the gate, the SCR remains clamped to conduct the forward current so long as the conducted current from the ESD event remains above an engineered holding current. When the conducted current from the ESD event drops below the holding current, the SCR returns to its quiescent state.

Improved fabrication methods and device structures for a silicon-controlled rectifier are needed.

SUMMARY

According to an embodiment, a device structure is provided for a silicon-controlled rectifier. The structure includes a substrate having a top surface, a first well of a first conductivity type arranged in the substrate, and second and third wells of a second conductivity type arranged in the substrate between the first well and the top surface of the substrate. A deep trench isolation region is laterally arranged between the first well of the second conductivity type and the second well of the second conductivity type. The second well is adjoined with the first well along a first interface, the third well is adjoined with the first well along a second interface, and the deep trench isolation region extends the top surface of the substrate past the first interface and the second interface and into the first well. A doped region of the first conductivity type is arranged in the substrate between the second well and the top surface of the substrate.

According to an embodiment, a method is provided for forming a device structure for a silicon-controlled rectifier. The method includes forming a first well of a first conductivity type arranged in a substrate, forming a second well of a second conductivity type and a third well of the second conductivity type each arranged in the substrate between the first well and a top surface of the substrate, and forming a deep trench isolation region laterally arranged between the first well of the second conductivity type and the second well of the second conductivity type. The second well is adjoined with the first well along a first interface, the third well is adjoined with the first well along a second interface, and the deep trench isolation region extends from the top surface of the substrate past the first interface and the second interface and into the first well. A doped region of the first conductivity type arranged is formed in the substrate between the second well and the top surface of the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
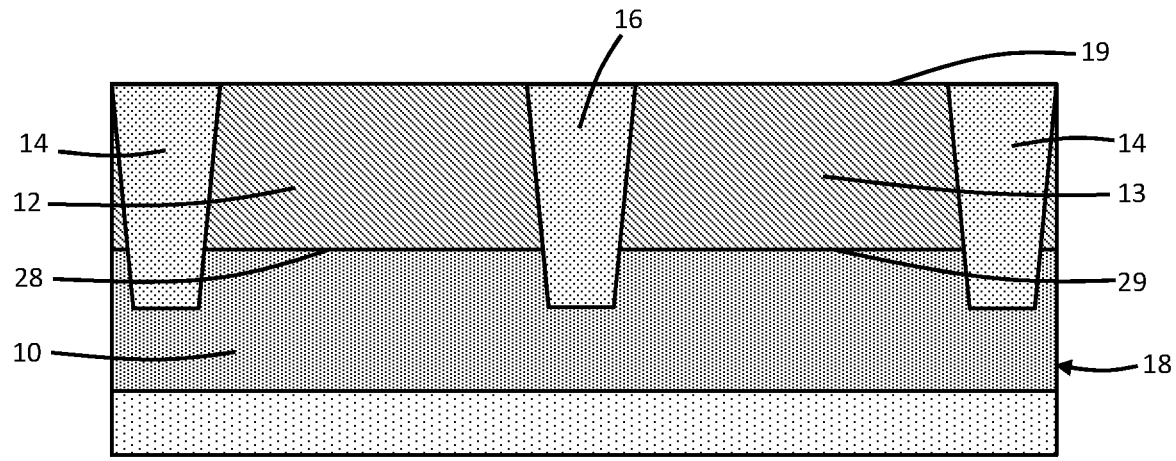
FIGS. 1-3 are cross-sectional views of a device structure at successive fabrication stages of a processing method in accordance with embodiments of the invention.

With reference to FIG. 1 and in accordance with embodiments of the invention, a deep well 10, wells 12, 13, and deep trench isolation regions 14, 16 are arranged in a substrate 18. The substrate 18 may be a bulk substrate that contains a single-crystal semiconductor material, such as single-crystal silicon. The deep well 10 contains single-crystal semiconductor material having an opposite conductivity type from the semiconductor material of the substrate 18 beneath the deep well 10. The wells 12, 13 contain single-crystal semiconductor material having an opposite conductivity type from the semiconductor material of the deep well 10. The wells 12, 13 are arranged in a vertical direction between the deep well 10 and a top surface 19 of the substrate 18.

The deep well 10 may be formed by introducing a dopant into the substrate 18 over a given depth range to provide a depth profile characterizing the dopant concentration as a function of depth. In an embodiment, the deep well 10 may be formed by implanting ions containing the dopant under a given set of implantation conditions (e.g., ion species, dose, kinetic energy, implantation angle) into the substrate 18. In an embodiment, the deep well 10 may contain a concentration of an n-type dopant (e.g., phosphorus (P), arsenic (As), and/or antimony (Sb)) that provides n-type conductivity. The ions used to form the deep well 10 may be generated from a suitable source gas and implanted into the substrate 18 with the given set of implantation conditions using an ion implantation tool. The given set of implantation conditions may be selected to tune the electrical and physical characteristics (e.g., electrical resistivity and depth profile) of the deep well 10.

The wells 12, 13 may be formed by introducing a dopant into the substrate 18 over a depth range to provide a depth profile characterizing the dopant concentration as a function of depth. The depth profile for the wells 12, 13 is shallower within the substrate 18 than the depth profile of the deep well 10. In an embodiment, the wells 12, 13 may be concurrently formed by implanting ions containing the dopant under a given set of implantation conditions (e.g., ion species, dose, kinetic energy, implantation angle) into the substrate 18. In an embodiment, the wells 12, 13 may contain a concentration of a p-type dopant (e.g., boron (B) and/or indium (In)) that provides p-type electrical conductivity. The ions used to form the wells 12, 13 may be generated from a suitable source gas and implanted into the substrate 18 with the given set of implantation conditions using an ion implantation tool. The given set of implantation conditions may be selected to tune the electrical and physical characteristics (e.g., electrical resistivity and depth profile) of the wells 12, 13 and, in particular, to place the depth profile for the wells 12, 13 at the shallower depth in the substrate 18 than the depth profile for the deep well 10.

The well 12 adjoins the deep well 10 along an interface 28 at which the conductivity type of the semiconductor material changes to provide a p-n junction. Similarly, the well 13 adjoins the deep well 10 along an interface 29 at which the conductivity type of the semiconductor material changes to provide a p-n junction In an alternative embodiment, the conductivity types of the deep well 10 and wells 12, 13 may be swapped such that the semiconductor material of the deep well 10 has p-type conductivity and the semiconductor material of the wells 12, 13 has n-type conductivity. The deep well 10 may be formed in the substrate 18 either before or after the wells 12, 13 are formed in the substrate 18. In an embodiment, the deep well 10 and the wells 12, 13 may each contain lightly-doped semiconductor material formed through a selection of the different given sets of implantation conditions.

The deep trench isolation regions 14, 16 may be formed by defining deep trenches extending into the substrate 18 with lithography and etching processes, depositing a dielectric material to fill the deep trenches, and planarizing and/or recessing the dielectric material. The dielectric material contained in the deep trench isolation regions 14, 16 may be an oxide of silicon (e.g., silicon dioxide) and/or another electrical insulator deposited by chemical vapor deposition. The deep trench isolation regions 14, 16 extend from a top surface of the substrate 18 through the interfaces 28, 29 with the wells 12, 13 and penetrate into the deep well 10 beneath the wells 12, 13. The deep trench isolation regions 14, 16 extend to a greater depth in the substrate 18 than the wells 12, 13, and penetrate only partially through the deep well 10 such that the electrical and physical continuity of the deep well 10 is not interrupted. The deep trench isolation region 16 is arranged laterally between the well 12 and the well 13. The well 12 is surrounded by one of the deep trench isolation regions 14 and the deep trench isolation region 16. The well 13 is surrounded by the other of the deep trench isolation regions 14 and the deep trench isolation region 16. Depending on the order of formation, the wells 12, 13 may present a continuous doped layer formed in the substrate 18 prior to the formation of the deep trench isolation regions 14, 16.

Figure 2:
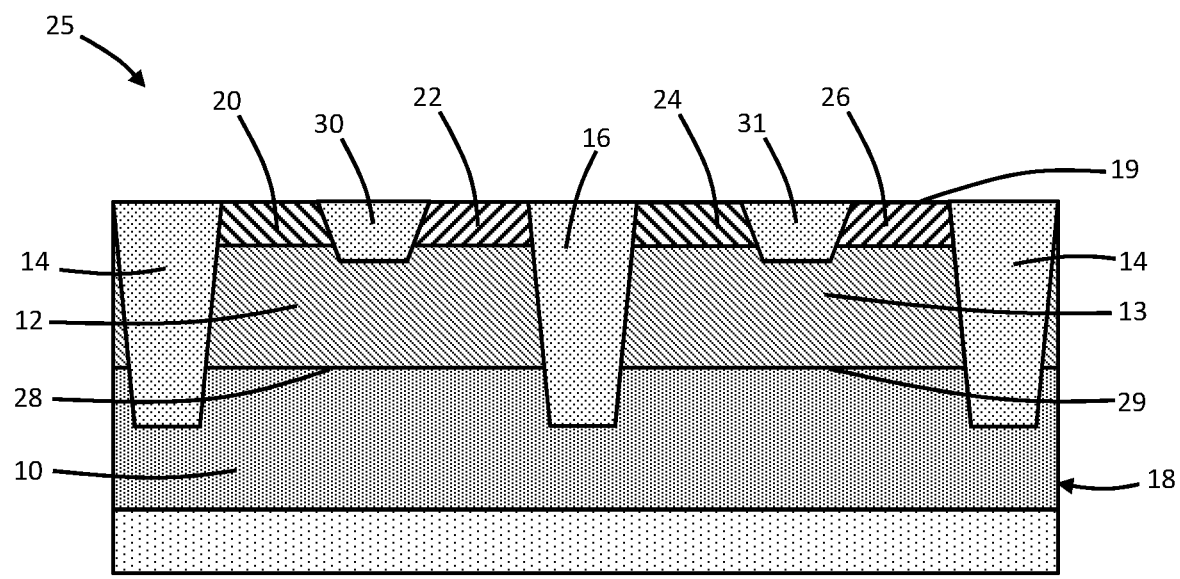

With reference to FIG. 2 in which like reference numerals refer to like features in FIG. 1 and at a subsequent fabrication stage, multiple doped regions 20, 22 are formed in the well 12, and multiple doped regions 24, 26 are formed in the well 13. The doped regions 20, 22, which have opposite conductivity types, are arranged in a vertical direction between the well 12 and a top surface 19 of the substrate 18. The doped regions 24, 26, which also have opposite conductivity types, are also arranged in the vertical direction between the well 13 and the top surface 19 of the substrate 18. The doped regions 20, 22, 24, 26 may be accessible at the top surface 19 of the substrate 18 for establishing vertical electrical connections with an overlying interconnect structure.

The doped region 20 may contain heavily-doped semiconductor material having the same conductivity type as the well 12, and the doped region 26 may contain heavily-doped semiconductor material having the same conductivity type as the well 13. The doped regions 20, 26, which have the same conductivity type, may be concurrently formed by ion implantation or by epitaxial growth. If formed by implantation, a patterned implantation mask may be used to define selected locations that are implanted and is stripped after implantation. The implantation mask may include a resist layer applied by a spin coating process, pre-baked, exposed to light projected through a photomask, baked after exposure, and developed with a chemical developer. The doped region 20, 26 may be concurrently formed by implanting ions containing the dopant under a given set of implantation conditions (e.g., ion species, dose, kinetic energy, implantation angle) into the substrate 18. The implantation mask has a thickness and stopping power sufficient to block masked areas against receiving a dose of the implanted ions. The ions used to form the doped regions 20, 26 may be generated from a suitable source gas and implanted into the substrate 18 with the given set of implantation conditions using an ion implantation tool. The given set of implantation conditions may be selected to tune the electrical and physical characteristics (e.g., electrical resistivity and depth profile) of the doped regions 20, 26.

The doped region 22 may contain heavily-doped semiconductor material having an opposite conductivity type from the well 12, and the doped region 24 may contain heavily-doped semiconductor material having an opposite conductivity type from the well 13. The doped regions 22, 24, which have the same conductivity type, may be formed by ion implantation or by epitaxial growth. If formed by implantation, a patterned implantation mask may be used to define selected locations that are implanted and is stripped after implantation. The implantation mask may include a resist layer applied by a spin coating process, pre-baked, exposed to light projected through a photomask, baked after exposure, and developed with a chemical developer. The doped region 22, 24 may be concurrently formed by implanting ions containing the dopant under a given set of implantation conditions (e.g., ion species, dose, kinetic energy, implantation angle) into the substrate 18. The implantation mask has a thickness and stopping power sufficient to block masked areas against receiving a dose of the implanted ions. The ions used to form the doped regions 22, 24 may be generated from a suitable source gas and implanted into the substrate 18 with the given set of implantation conditions using an ion implantation tool. The given set of implantation conditions may be selected to tune the electrical and physical characteristics (e.g., electrical resistivity and depth profile) of the doped regions 22, 24. The implantation mask has a thickness and stopping power sufficient to block masked areas against receiving a dose of the implanted ions.

In an embodiment in which the wells 12, 13 contain p-type semiconductor material and the deep well 10 contains n-type semiconductor material, the doped regions 20, 26 may contain a concentration of a p-type dopant (e.g., boron (B) and/or indium (In)) that provides p-type electrical conductivity, and the doped regions 22, 24 may contain a concentration of an n-type dopant (e.g., phosphorus (P), arsenic (As), and/or antimony (Sb)) that provides n-type conductivity. In an embodiment in which the wells 12, 13 contain n-type semiconductor material and the deep well 10 contains p-type semiconductor material, the doped regions 20, 26 may contain a concentration of an n-type dopant, and the doped regions 22, 24 may contain a concentration of a p-type dopant. The doped regions 20, 26 may be formed either before or after the doped regions 22, 24 are formed.

As used herein, heavily doped semiconductor material may be considered to have a dopant concentration that is at least an order of magnitude higher than the dopant concentration in lightly doped semiconductor material. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

Shallow trench isolation regions 30, 31 may be formed by defining shallow trenches in the substrate 18 with lithography and etching processes, depositing a dielectric material to fill the shallow trenches, and planarizing and/or recessing the dielectric material. The shallow trench isolation regions 30, 31 may be composed of an oxide of silicon (e.g., silicon dioxide) and/or another electrical insulator deposited by chemical vapor deposition (CVD). The shallow trench isolation region 30 is arranged between the doped region 20 and the doped region 22, and the shallow trench isolation region 31 is between the doped region 24 and the doped region 26. The shallow trench isolation regions 30, 31 extend to a shallower depth within the substrate 18 than the deep trench isolation regions 14, 16.

The doped region 20, the doped region 22, and the shallow trench isolation region 30 between the doped regions 20, 22 are surrounded by the deep trench isolation region 14 and one of the deep trench isolation regions 16. Similarly, the doped region 24, the doped region 26, and the shallow trench isolation region 31 between the doped regions 24, 24 are also surrounded by the deep trench isolation region 14 and the other of the deep trench isolation regions 16.

The resultant device structure is a bi-directional silicon-controlled rectifier (SCR) 25 in which the doped region 22 may function as an anode of the SCR 25, the doped region 26 may function as a cathode of the SCR 25, and the doped region 20 may function as a body contact to the well 12. Alternatively, due to symmetry providing the bi-directionality, the doped region 24 may function as an anode of the SCR 25, the doped region 20 may function as a cathode of the SCR 25, and the doped region 26 may function as a body contact to the other of the sections of the well 13. The SCR 25 includes p-n junctions across each of which the conductivity type of the semiconductor material changes from n-type to p-type. The wells 12, 13 and the deep well 10 provide oppositely doped layers of the SCR 25 that supply three of the p-n junctions of the SCR 25. The doped region 22 and the well 12 provide the fourth p-n junction of the SCR 25 for one direction of operation, and the doped region 24 and the well 13 provide the fourth p-n junction of the SCR 25 for the other direction of operation.

The deep trench isolation regions 14, 16 replace wells of semiconductor material doped to have the same conductivity type as the deep well 10 that are employed in conventional bi-directional silicon-controlled rectifiers as electrical isolation. As a result, the SCR 25 may be more compact than conventional bi-directional silicon controlled rectifiers and, moreover, may exhibit a lower capacitance than conventional bi-directional silicon controlled rectifiers.

Figure 3:
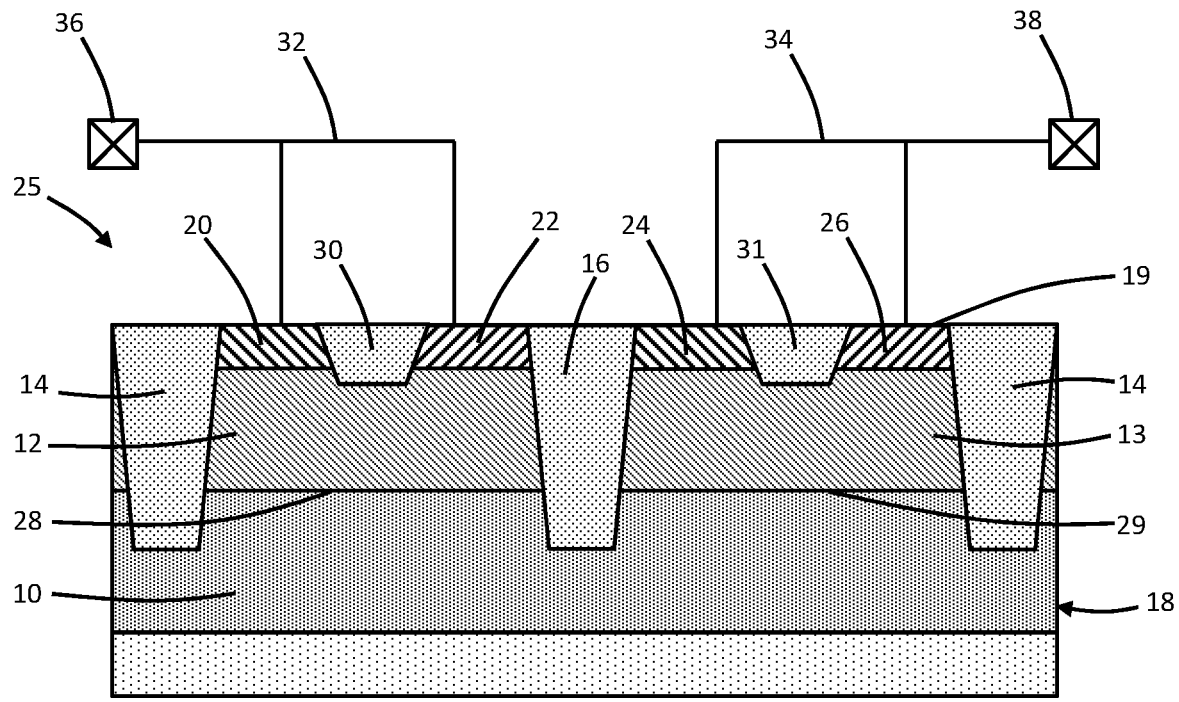

With reference to FIG. 3 in which like reference numerals refer to like features in FIG. 2 and at a subsequent fabrication stage, middle-of-line (MOL) and back-end-of-line (BEOL) processing follows, which includes formation of an interconnect structure coupled with the SCR 25. The interconnect structure may include parallel electrical connections 32 extending from a pad 36 to the doped regions 20, 22 and parallel electrical connections 34 extending from another pad 38 to the doped regions 24, 26.

The SCR 25 may be deployed in an electrostatic discharge (ESD) protection circuit configured to divert current from an ESD pulse to ground and away from sensitive integrated circuits. During an ESD event, the current path between the anode and cathode may be routed from the pad 36 to the doped region 22, from the doped region 22 to the well 12, from the well 12 to the deep well 10 and beneath the deep trench isolation region 16 in the deep well to the well 13 that is connected by doped region 26 with the pad 38. For example, the doped region 26 may be connected by the pad 38 with ground, and the doped region 22 may be connected by the pad 36 with a radiofrequency antenna that is susceptible to an ESD event. Alternatively, during an ESD event, the current path between the anode and cathode may be routed from the pad 38 to the doped region 24, from the doped region 24 to the well 13, from the well 13 to the deep well 10 and beneath the deep trench isolation region 16 in the deep well to the well 12 that is connected by doped region 20 with the pad 36. For example, the doped region 22 may be connected by the pad 36 with ground, and the doped region 26 may be connected by the pad 38 with a radiofrequency antenna that is susceptible to an ESD event.

Figure 4:
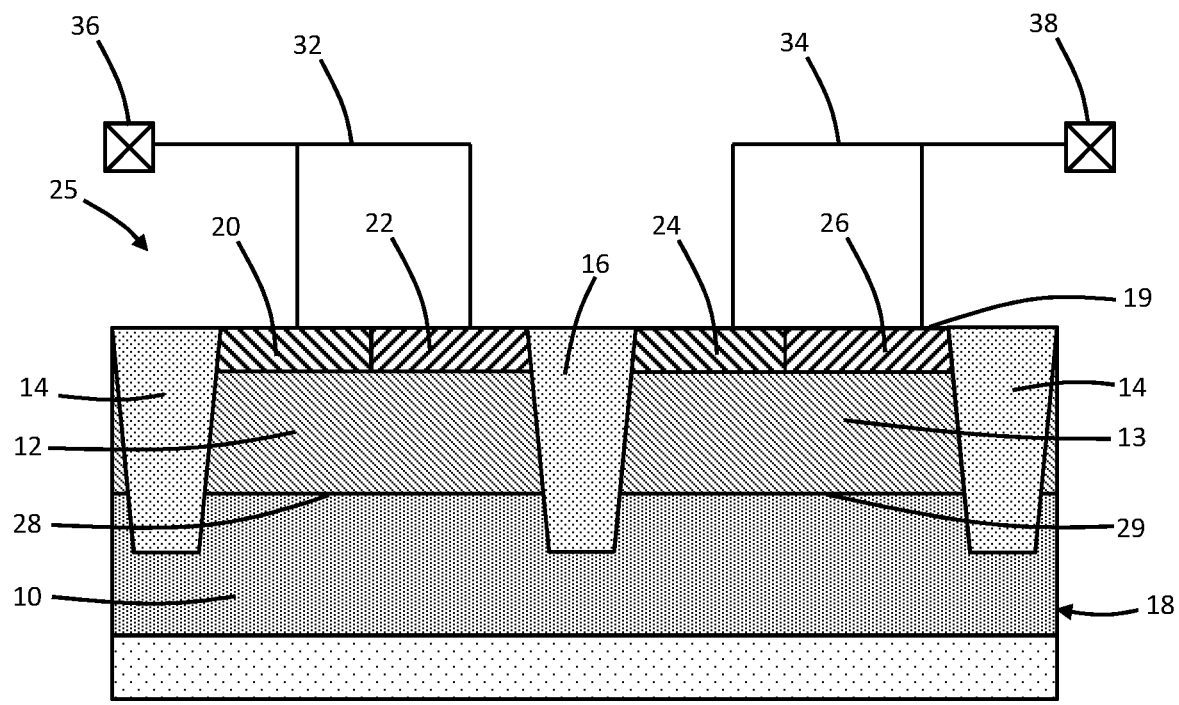
FIGS. 4 and 5 are cross-sectional views of device structures in accordance with alternative embodiments of the invention.

With reference to FIG. 4 in which like reference numerals refer to like features in FIG. 2 and in accordance with alternative embodiments, the shallow trench isolation regions 30 may be omitted from the construction of the SCR 25. The doped region 20 is abutted and juxtaposed in direct contact with the doped region 22, and the doped region 26 is abutted and juxtaposed in direct contact with the doped region 24.

Figure 5:
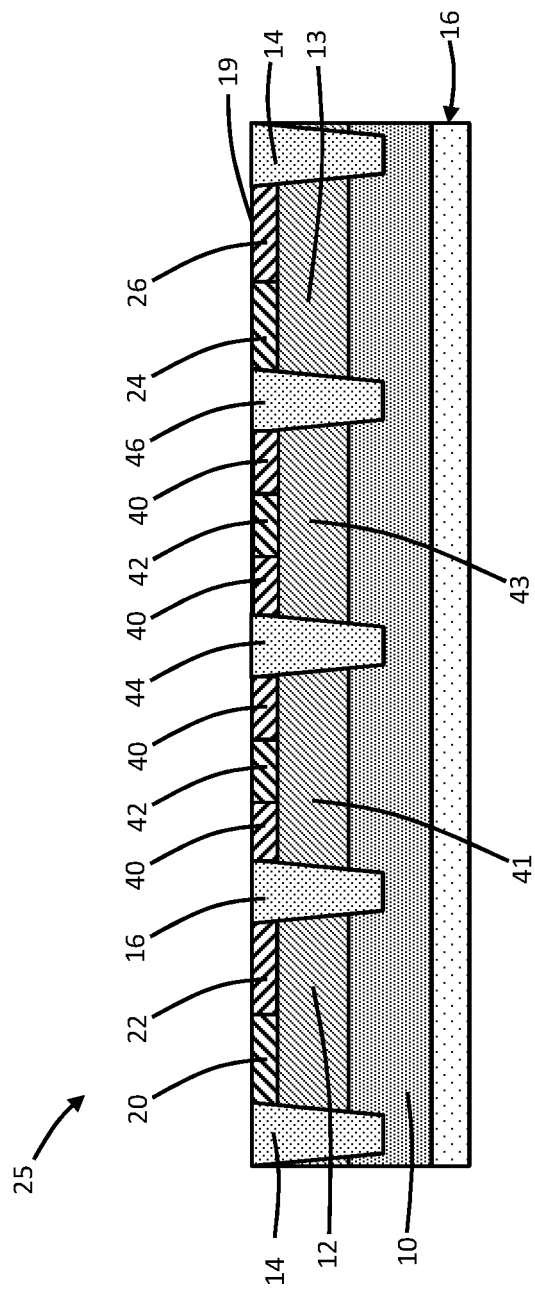

With reference to FIG. 5 in which like reference numerals refer to like features in FIG. 3 and in accordance with alternative embodiments, additional wells 41, 43 and deep trench isolation regions 44, 46 may added to provide the SCR 25 with multiple fingers. The doped regions 20, 22 in the well 12 are retained, as are the doped regions 24, 26 in the well 13 and the deep trench isolation regions 14, 16. Each intervening finger includes additional doped regions 40 that are doped to have the same conductivity type as doped regions 22, 24, and additional doped regions 42 that are doped to have the same conductivity type as doped regions 20, 26. The doped regions 40, 42 in well 43 may be connected in parallel by electrical connections similar to electrical connections 32 with the pad 36 (FIG. 3). The doped regions 40, 42 in well 41 may be connected in parallel by electrical connections similar to electrical connections 34 with the pad 38 (FIG. 3). The multiple-finger version of the SCR 25 provides parallel current paths that increase the current-handling capability of the SCR 25 during an ESD event. In an alternative embodiment, the multiple-finger version of the SCR 25 may include the shallow trench isolation regions 30 as shown in FIG. 2.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a silicon-controlled rectifier, the device structure comprising:
    a substrate having a top surface;
    a first well of a first conductivity type arranged in the substrate;
    a second well of a second conductivity type arranged in the substrate between the first well and the top surface of the substrate, the second well adjoined with the first well along a first interface;
    a third well of the second conductivity type arranged in the substrate between the first well and the top surface of the substrate, the third well adjoined with the first well along a second interface;
    a first deep trench isolation region laterally arranged in the substrate between the third well of the second conductivity type and the second well of the second conductivity type, the first deep trench isolation region extending from the top surface of the substrate past the first interface and the second interface and into the first well; and
    a first doped region of the first conductivity type arranged in the substrate between the second well and the top surface of the substrate,
    wherein the first well extends continuously beneath the first deep trench isolation region.

2. The device structure of claim 1 further comprising:
    a doped region of the second conductivity type arranged in the substrate between the second well and the top surface of the substrate.

3. The device structure of claim 2 further comprising:
    a shallow trench isolation region laterally arranged between the first doped region of the first conductivity type and the doped region of the second conductivity type, the shallow trench isolation region extending from the top surface of the substrate to the second well.

4. The device structure of claim 2 wherein the first doped region of the first conductivity type and the doped region of the second conductivity type are arranged in direct contact.

5. The device structure of claim 2 further comprising:
    a second doped region of the first conductivity type arranged in the substrate between the third well and the top surface of the substrate.

6. The device structure of claim 1 further comprising:
    a second doped region of the first conductivity type arranged in the substrate between the third well and the top surface of the substrate.

7. The device structure of claim 6 further comprising:
    a doped region of the second conductivity type arranged in the substrate between the third well and the top surface of the substrate.

8. The device structure of claim 7 further comprising:
    a shallow trench isolation region laterally arranged between the second doped region of the first conductivity type and the doped region of the second conductivity type, the shallow trench isolation region extending from the top surface of the substrate to the third well.

9. The device structure of claim 1 further comprising:
    a second deep trench isolation region extending from the top surface of the substrate into the first well,
    wherein the second well is laterally surrounded by the first deep trench isolation region and the second deep trench isolation region.

10. The device structure of claim 9 further comprising:
    a third deep trench isolation region extending from the top surface of the substrate into the first well,
    wherein the third well is laterally surrounded by the first deep trench isolation region and the third deep trench isolation region.

11. The device structure of claim 10 wherein the first well extends in part from the first deep trench isolation region to the second deep trench isolation region beneath the second well, and the first well extends in part from the second deep trench isolation region to the third deep trench isolation region beneath the third well.

12. The device structure of claim 1 wherein the first deep trench isolation region extends partially through the first well.

13. The device structure of claim 1 further comprising:
a fourth well of the second conductivity type arranged in the substrate between the first well and the top surface of the substrate;
a second deep trench isolation region laterally arranged between the second well of the second conductivity type and the fourth well of the second conductivity type, the second deep trench isolation region extending from the top surface of the substrate into the first well and to a greater depth in the substrate than the second well and the third well; and
a second doped region of the first conductivity type arranged in the substrate between the fourth well and the top surface of the substrate.

14. The device structure of claim 1 wherein the first conductivity type is n-type, and the second conductivity type is p-type.

15. A method for forming a device structure for a silicon-controlled rectifier, the method comprising:
forming a first well of a first conductivity type arranged in a substrate;
forming a second well of a second conductivity type and a third well of the second conductivity type each arranged in the substrate between the first well and a top surface of the substrate;
forming a first deep trench isolation region laterally arranged between the third well of the second conductivity type and the second well of the second conductivity type; and
forming a first doped region of the first conductivity type arranged in the substrate between the second well and the top surface of the substrate,
wherein the second well is adjoined with the first well along a first interface, the third well is adjoined with the first well along a second interface, the first deep trench isolation region extends from the top surface of the substrate past the first interface and the second interface and into the first well, and the first well extends continuously beneath the first deep trench isolation region.

16. The method of claim 15 further comprising:
forming a second deep trench isolation region extending from the top surface of the substrate into the first well,
wherein the second well is laterally surrounded by the first deep trench isolation region and the second deep trench isolation region.

17. The method of claim 16 further comprising:
forming a third deep trench isolation region extending from the top surface of the substrate into the first well,
wherein the third well is laterally surrounded by the first deep trench isolation region and the third deep trench isolation region.

18. The method of claim 17 wherein the first well extends in part from the first deep trench isolation region to the second deep trench isolation region beneath the second well, and the first well extends in part from the second deep trench isolation region to the third deep trench isolation region beneath the third well.

19. The method of claim 15 further comprising:
forming a doped region of the second conductivity type arranged in the substrate between the second well and the top surface of the substrate.

20. The method of claim 19 further comprising:
forming a shallow trench isolation region laterally arranged between the first doped region of the first conductivity type and the doped region of the second conductivity type,
wherein the shallow trench isolation region extends from the top surface of the substrate to the second well.

* * * * *